(12) United States Patent
Chan et al.

(10) Patent No.: US 6,380,088 B1
(45) Date of Patent: Apr. 30, 2002

(54) METHOD TO FORM A RECESSED SOURCE DRAIN ON A TRENCH SIDE WALL WITH A REPLACEMENT GATE TECHNIQUE

(75) Inventors: Lap Chan, San Francisco, CA (US); Elgin Quek, Singapore (SG); Ravi Sundaresan, San Jose, CA (US); Yang Pan; James Yong Meng Lee, both of Singapore (SG); Ying Keung Leung, Aberdeen (HK); Yelehanka Ramachandramurthy Pradeep; Jia Zhen Zheng, both of Singapore (SG)

(73) Assignee: Chartered Semiconductor Manufacturing, Inc., Milpitas, CA (US)

( * ) Notice: Subject to any disclaimer, the term of this patent is extended or adjusted under 35 U.S.C. 154(b) by 0 days.

(21) Appl. No.: 09/764,241

(22) Filed: Jan. 19, 2001

(51) Int. Cl.[7] .............................................. H01L 21/302
(52) U.S. Cl. ...................... 438/694; 438/696; 438/697; 438/699; 438/700; 438/701
(58) Field of Search ................ 438/694, 696, 438/697, 699, 700, 701, 259

(56) References Cited

U.S. PATENT DOCUMENTS

| | | | |
|---|---|---|---|
| 5,380,671 A | 1/1995 | Lur et al. ...................... 437/41 |
| 5,455,189 A * | 10/1995 | Grubisich .................... 438/207 |
| 5,643,822 A | 7/1997 | Furukawa et al. ............. 437/67 |
| 5,710,076 A * | 1/1998 | Dai et al. ..................... 438/305 |
| 5,795,811 A | 8/1998 | Kim et al. .................... 438/404 |
| 5,834,360 A * | 11/1998 | Tesauro et al. .............. 438/445 |
| 5,879,998 A | 3/1999 | Krivokapic .................. 438/300 |
| 6,214,670 B1 * | 4/2001 | Shih et al. ................... 438/259 |
| 6,225,659 B1 * | 5/2001 | Liu ............................ 257/314 |

* cited by examiner

Primary Examiner—Benjamin L. Utech
Assistant Examiner—Binh X Tran
(74) Attorney, Agent, or Firm—George O. Saile; Rosemary L. S. Pike; William J. Stoffel

(57) ABSTRACT

An improved MOS transistor and method of making an improved MOS transistor. An MOS transistor having a recessed source drain on a trench sidewall with a replacement gate technique. Holes are formed in the shallow trench isolations, which exposes sidewall of the substrate in the active area. Sidewalls of the substrate are doped in the active area where holes are. Conductive material is then formed in the holes and the conductive material becomes the source and drain regions. The etch stop layer is then removed exposing sidewalls of the conductive material, and oxidizing exposed sidewalls of the conductive material is preformed. Spacers are formed on top of the pad oxide and on the sidewalls of the oxidized portions of the conductive material. The pad oxide layer is removed from the structure but not from under the spacers. A gate dielectric layer is formed on the substrate in the active area between the spacers; and a gate electrode is formed on said gate dielectric layer.

29 Claims, 6 Drawing Sheets

METHOD TO FORM A RECESSED SOURCE DRAIN ON A TRENCH SIDE WALL WITH A REPLACEMENT GATE TECHNIQUE

BACKGROUND OF THE INVENTION

1. Field of Invention

The present invention relates generally to semiconductor devices and to an improved MOS transistor and the method of making an MOS transistor. More particularly, the present invention relates to a method to form a recessed source drain on a trench sidewall with a replacement gate technique.

2. Description of Prior Art

MOS transistors are well known in the art, however there are some structures of MOS transistors that show problems. High junction capacitance degrades speed and performance of a transistor. This high junction capacitance can be reduced by the sitting source drain on top of the shallow trench isolation of a transistor. High junction leakages produce size problems so that the transistor has to be made bigger then ideal. This high junction leakage can be reduced when only the lightly doped drain is on top of a substrate. Finally, scaling of the active area effects the overall package density of a transistor and a vertical active contact, results in a better smaller package of a transistor.

For Example, U.S. Pat. No. 5,795,811 (Kim et al.) discloses a shallow trench isolation process, but does not disclose the source drain sitting on top of the shallow trench isolation. U.S. Pat. No. 5,380,671 (Lur et al.) shows a buried contact method near the shallow trench isolations. U.S. Pat. No. 5, 643,822 (Furukawa et al.) teaches an ion implant into the shallow trench isolations silicon trench sidewalls. U.S. Pat. No. 5,879,998 (Krivokapic) shows a replacement gate process.

SUMMARY OF THE INVENTION

Accordingly, the present invention provides an improved MOS transistor and method of making an improved MOS transistor. Another purpose of the present invention is to provide an MOS transistor having a recessed source drain on a trench sidewall with a replacement gate technique. MOS transistors are well known in the art, and it is well known in the art that they can be either an N-MOS transistor or a P-MOS transistor. In this application we will show an N-MOS transistor, but as well known in the art, one can easily apply these descriptions to a P-MOS transistor.

A method for forming an MOS transistor by first providing a substrate and forming a pad oxide over the substrate. Then forming an etch stop layer over the pad oxide and creating shallow trench isolations in the substrate pad oxide, and etch stop layers. Active areas of the substrate are located between the shallow trench isolations. Next holes are formed in the shallow trench isolations, which exposes sidewall of the substrate in the active area. Sidewalls of the substrate are doped in the active area where holes are. Conductive material is then formed in the holes and the conductive material becomes the source and drain regions.

The etch stop layer is then removed exposing sidewalls of the conductive material, and oxidizing exposed sidewalls of the conductive material is preformed. Spacers are formed on top of the pad oxide and on the sidewalls of the oxidized portions of the conductive material. The pad oxide layer is removed from the structure but not from under the spacers. A gate dielectric layer is formed on the substrate in the active area between the spacers; and a gate electrode is formed on said gate dielectric layer.

BRIEF DESCRIPTION OF THE DRAWINGS

In the accompanying drawings forming a material part of this description there is shown.

DETAILED DESCRIPTION OF THE INVENTION

Figure 1:
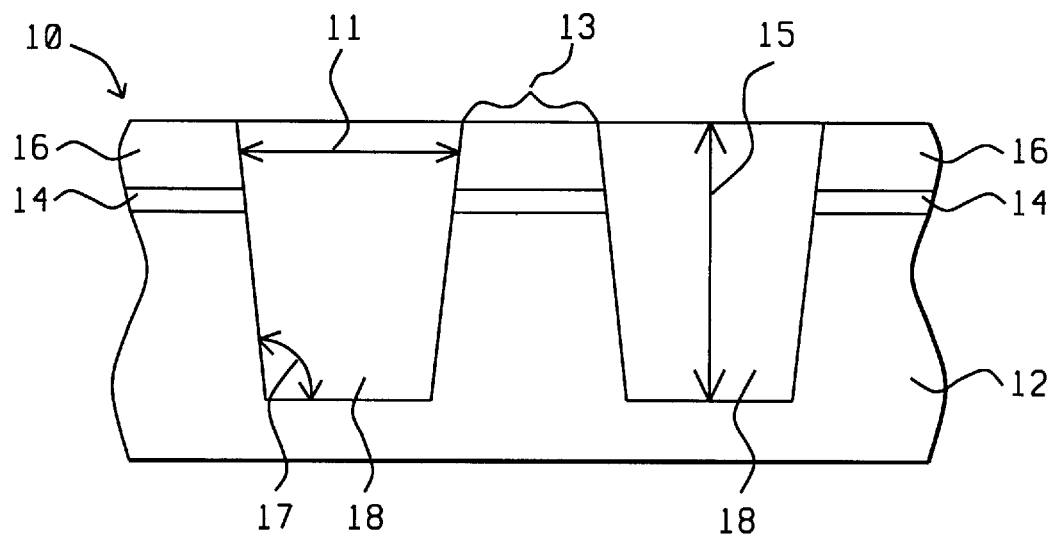
FIG. 1 shows a cross sectional view of a MOS transistor after a standard shallow trench isolation process.

Referring now more particularly to FIG. 1, a basic structure 10 is a standard MOS structure made by standard shallow trench isolation process. The shallow trench process consists of forming a trench through a pad dielectric layer, an etch stop layer and in the substrate. Filling the trench formed with a dielectric material, which forms shallow trench isolations. Finally, the dielectric material that fills the trench is then post chemical mechanically polished. Basic structure 10 has a substrate 12, with a pad dielectric layer 14 on the substrate 12. The pad dielectric layer 14 is preferably made of silicon oxide. The pad dielectric layer 14 has a thickness of about 100 to 200 Angstroms but preferably 150 Angstroms. An etch stop 16 is formed on the pad dielectric layer 14. The etch stop 16 is preferably silicon nitride. The etch stop 16 has a thickness of about 1000 to 2000 angstroms but preferably 1500 angstroms. The substrate, etch stop and pad dielectric layer having shallow trench isolations 18 located therein. The shallow trench isolations are usually made of silicon oxide. The shallow trench isolations 18 define active areas 13, which are areas of the substrate between the shallow trench isolations (STI).

Figure 2:
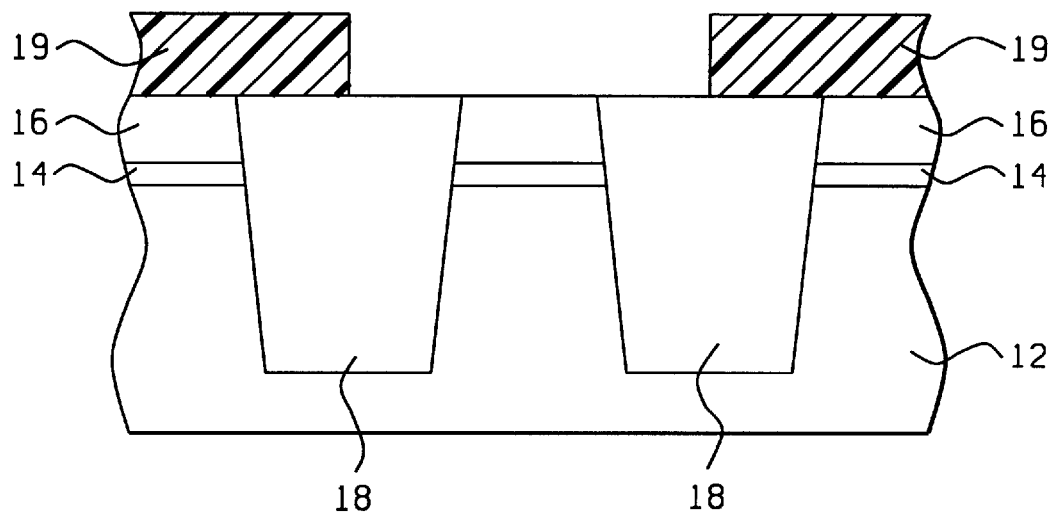
FIG. 2 shows a cross-sectional view of another step in the method of the present invention.

The dimensions of the shallow trench isolations 18 is a diameter at the top 11 of about 0.1 to 0.3 um and a depth 15 of 0.2 to 0.4 um. An angle 17 between the sidewall of the shallow isolation trench and the bottom of the shallow isolation trench is between 75 to 88 degrees. Therefore, the diameter at the bottom of the isolation trench would depend on the diameter at the top and the depth. The active area 13 is the distance between the two shallow isolation trenches 18 and is about 0.1 to 0.3 um. In FIG. 2 a photo-resist 19 is then placed on the structure to pattern the shallow trench isolations using etching that affects only the oxide.

Figure 3:
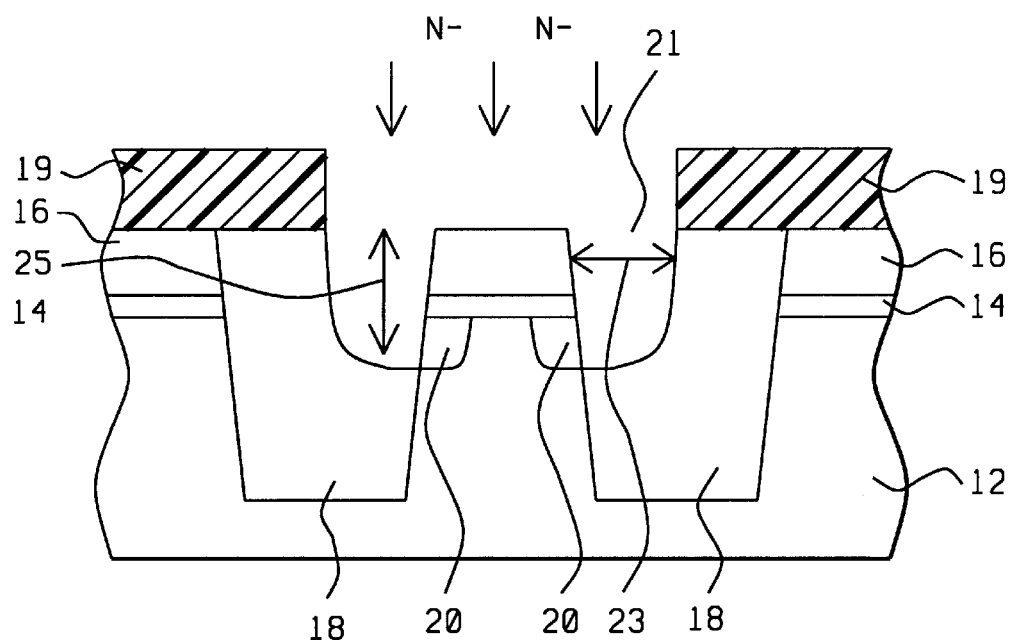
FIGS. 3–10 show cross-sectional views of a number of steps in the method of the present invention.

As shown in FIG. 3, the shallow trench isolation 18 is etched using the photoresist 19 as a etch mask. The etching forms a hole or pattern 21 at least partially surrounding an active area (the substrate between the shallow trench isolations 18). The pattern 21 is in the shallow trench isolation 18 is about 0.02 to 0.098 um deep 25 and about 0.05 to 0.2 in diameter 23.

As shown in FIG. 3, the substrate is ion implanted resulting in an N-area 20. The doped regions 20 are lightly doped source and drain regions (LDD) in the completed transistor.

Figure 4:
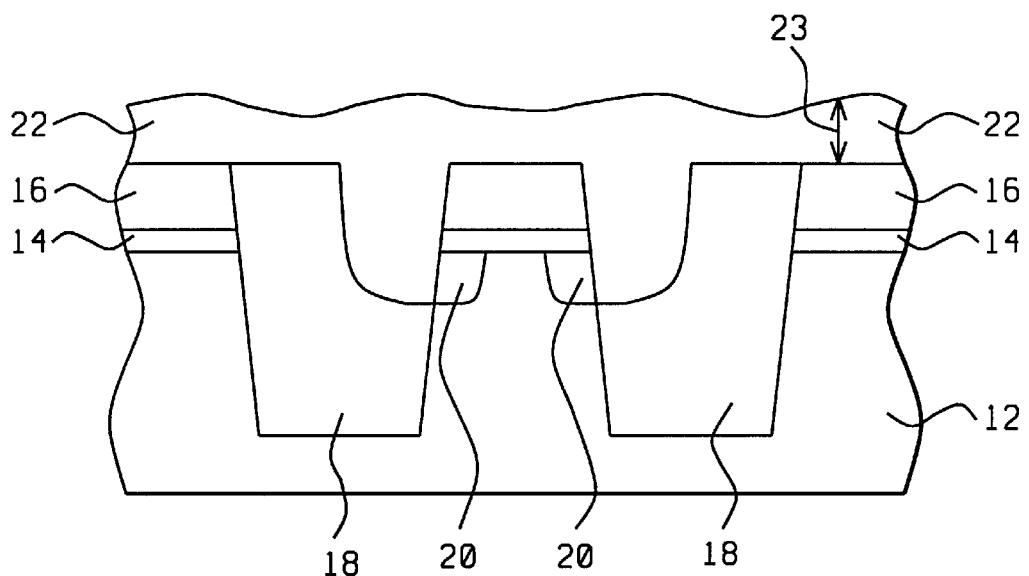

As shown in FIG. 4, the photo resist 19 is then stripped and cleaned off the structure of FIG. 3. Next, a conductive material 22 is then formed over the structure. The conductive material 22 is preferably doped and can be doped polysilicon, epitarial silicon, or polysilicon. This doped conductive material 22, is usually deposited doped polysilicon, and is about 500 to 1500 and preferably 1000 Angstroms thick from the top of the structure, see 23 of FIG. 4.

Figure 5:
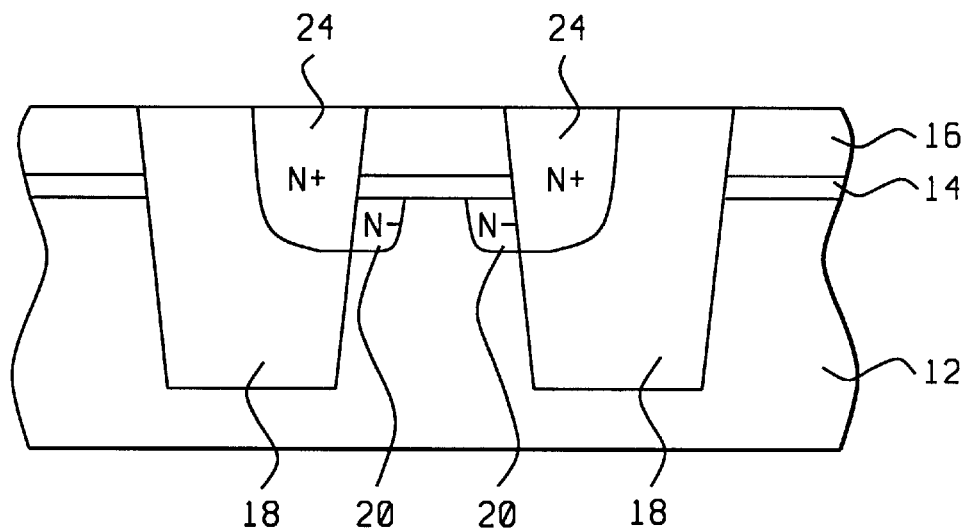

As shown in FIG. 5, the doped conductive material 22 is then chemically mechanically polished to form a doped conductive mass 24 (e.g., Source and Drain regions).

Figure 6:
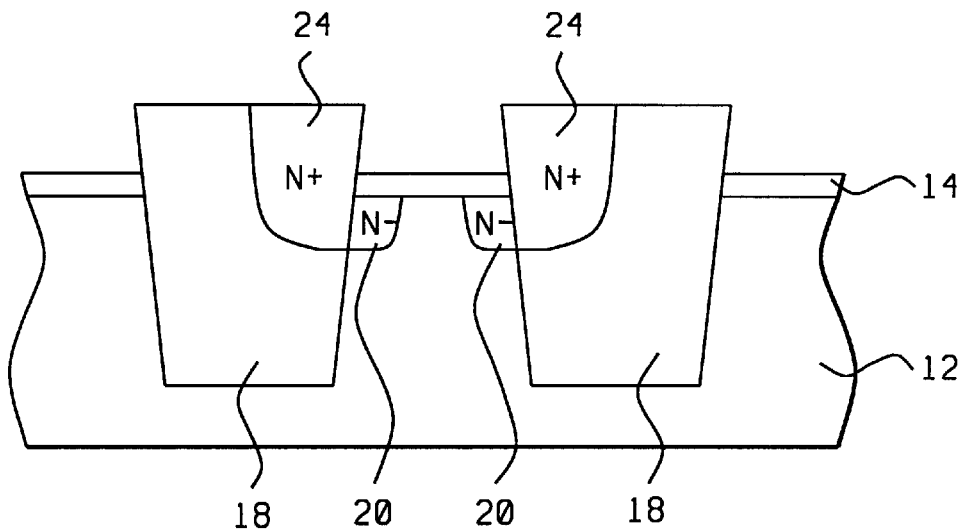
Figure 7:
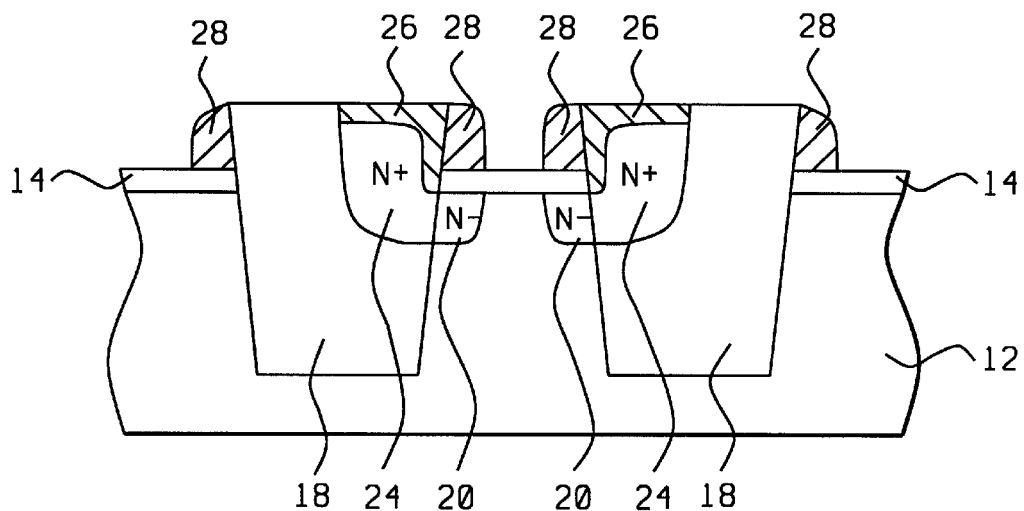

FIG. 6 shows the removal of the etch block 16, preferably by a selective hot phosphoric acid strip etch. In FIG. 7, polysilicon oxidation is preformed usually in an oxidation furnace to create a polyoxidation 26. The polyoxidation is between 180 and 220 Angstroms thick. Spacers 28 are then formed and are about 900 to 1100 angstroms thick. These spacers are usually made of an oxide or a nitride, and preferably a nitride. The spacers are formed by a conventional blanket deposition and an isotropic etch back.

Figure 8:
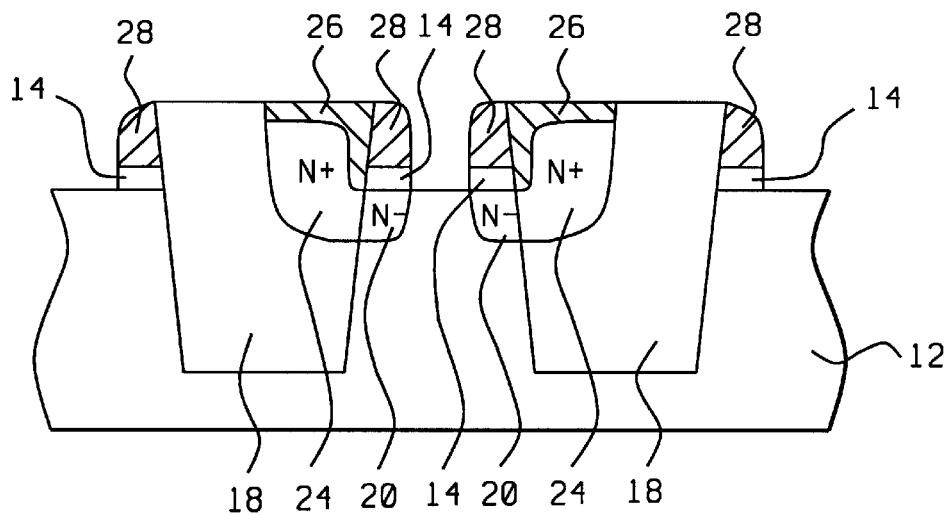
Figure 9:
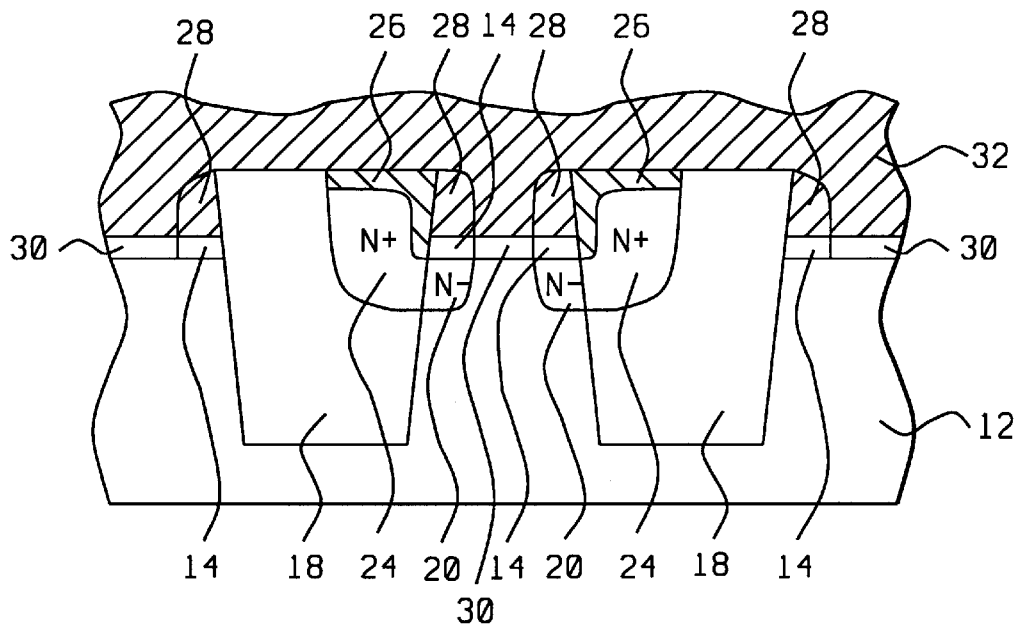

As shown in FIG. 8, the pad dielectric layer 14 is then removed and cleaned from the structure except for under the spacers 28. FIG. 9 illustrates a gate dielectric (e.g., oxide) layer 30 is then formed preferably by deposition. This gate dielectric layer 30 is preferably a high K oxide material such as silicon nitride, silicon oxide, tantalum oxide, zirconium oxide, or hafnium oxide.

Figure 10:
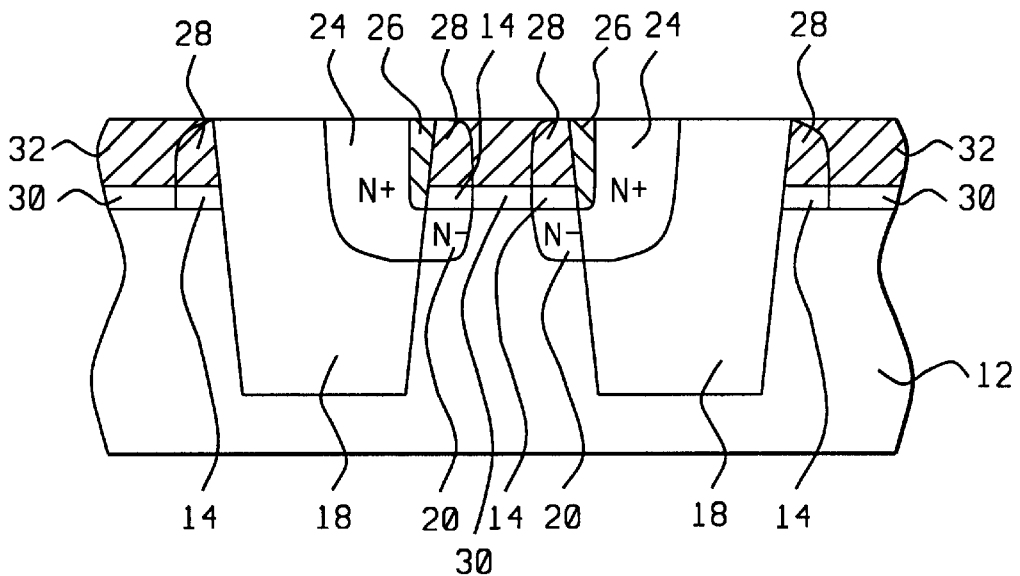
Figure 11:
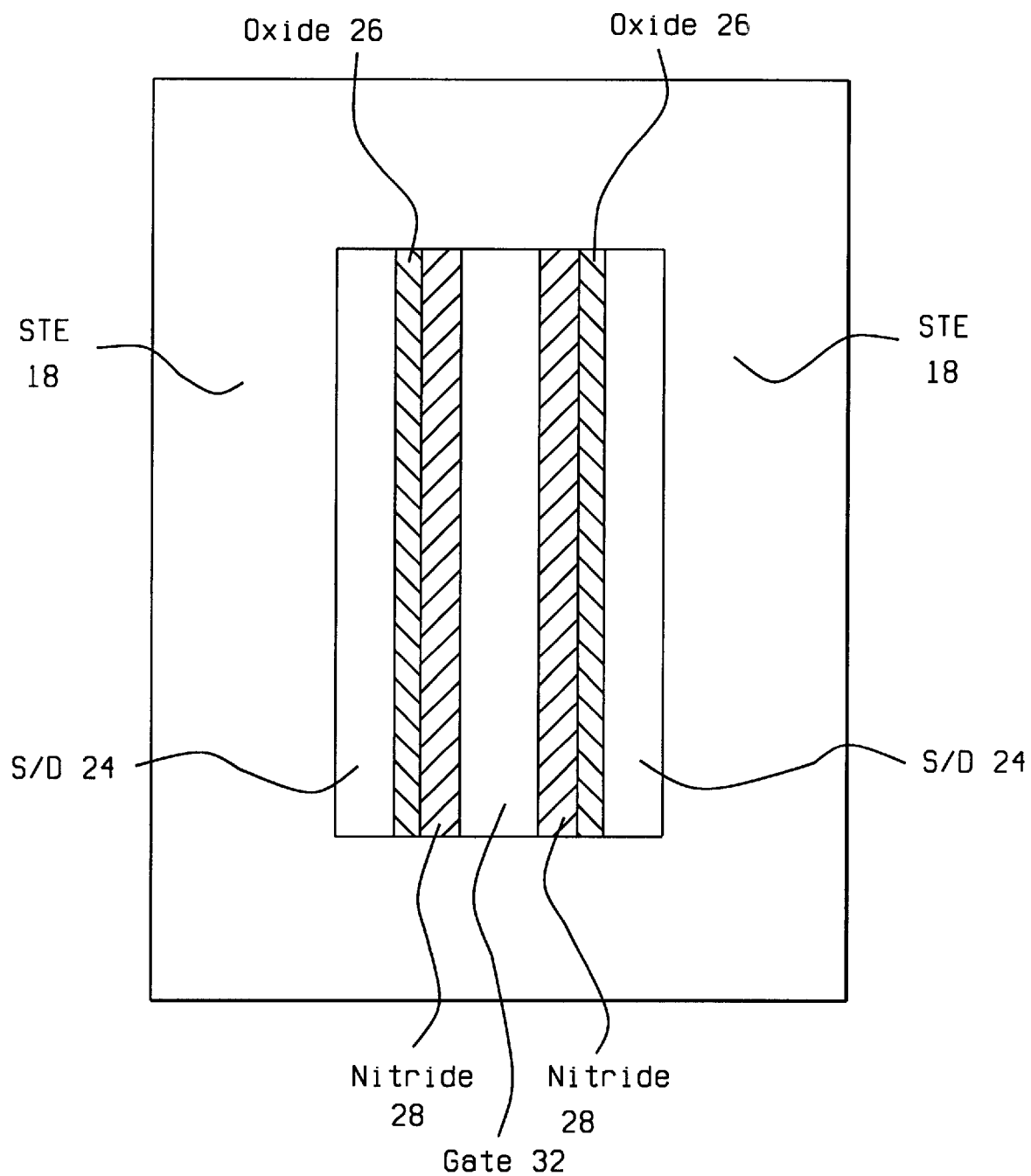
FIG. 11 shows a top down view of the present invention.

FIG. 10 illustrates a gate electrode material 32 is then formed usually by deposition, and then chemically mechanically polished down. The gate electrode material 32 is can be metal, metal silicide, or polysilicon, and is preferably Polysilicon. The doped conductive material 22, can alternatively be just conductive material when applied to the structure and then doped after the structure looks like FIG. 10. This doping of conductive material 22, can be done using a masked implant step.

While the invention has been particularly shown and described with reference to the preferred embodiments thereof, it will be understood by those skilled in the art that various changes in form, and details may be made without departing from the spirit and scope of the invention.

What is claimed is:

1. A method for forming an MOS transistor comprising:
    providing a substrate;
    forming a pad dielectric layer over said substrate;
    forming an etch stop layer over said pad dielectric;
    creating shallow trench isolations in the substrate pad oxide, and etch stop layers;
    active areas of said substrate located between said shallow trench isolations;
    forming holes in said shallow trench isolations which expose sidewalls of said substrate in said active area;
    doping said sidewalls of said substrate in the active area where said holes are;
    forming conductive material in said holes and said conductive material are source and drain regions;
    removing the etch stop layer exposing sidewalls of said conductive material
    oxidizing the exposed sidewalls of said conductive material;
    forming spacers on top of the pad dielectric layer and on the sidewalls of the oxidized portions of the conductive material;
    removing the pad dielectric layer from the structure but not from under the spacers;
    forming a gate dielectric layer on said substrate in said active area between said spacers; and
    forming a gate electrode on said gate dielectric layer.

2. The method of claim 1, wherein the shallow trench isolations have the following dimensions;
    A) diameter at top from about 0.1 to 0.3 um;
    B) depth from about 0.2 to 0.4 um; and
    C) an angle between a sidewall of the shallow isolation trench and a bottom of the shallow isolation trench is between about 75 to 88 degrees.

3. The method of claim 1, wherein the pad dielectric layer is silicon oxide.

4. The method of claim 1, wherein the etch stop layer is silicon nitride.

5. The method of claim 1, patterned openings in the sides of the shallow trench isolations is done by placing photo resist on the etch stop layer and using an etch that effects only oxide, and the photo-resist is stripped and cleaned from the structure.

6. The method of claim 1, wherein the patterned openings have the following dimensions; depth of about 0.02 to 0.098 um and diameter of about 0.05 to 0.2 um.

7. The method of claim 1, wherein the conductive material is polysilicon.

8. The method of claim 1, wherein the oxidized portions of the conductive material are formed by polysilicon oxidation in an oxidation furnace.

9. The method of claim 1, wherein the oxidized portions of the conductive material are about 180 to 220 angstroms thick.

10. The method of claim 1, wherein the spaces are about 900 to 1100 angstroms thick.

11. The method of claim 1, wherein the spacers are made of an oxide or a nitride.

12. The method of claim 1, wherein forming a gate dielectric layer is formed by deposition.

13. The method of claim 1, wherein the gate electrode is formed by depositing gate electrode material and chemically mechanically polishing the gate electrode material down.

14. The method of claim 1, wherein the gate electrode is polysilicon.

15. The method of claim 1, wherein the shallow trench isolations are created by: forming a trench through said pad dielectric layer, said etch stop layer and in said substrate; and filling said trench with a dielectric material to form said shallow trench isolations.

16. The method of claim 15, wherein the shallow trench isolations are made of silicon oxide.

17. The method of claim 1, wherein there are two shallow trench isolations.

18. The method of claim 17, wherein the distance between the two shallow trench isolations is about 0.1 to 0.3 um.

19. The method of claim 1, wherein the pad dielectric layer has a thickness of about 100 to 200 Angstroms.

20. The method of claim 19 wherein the pad dielectric layer thickness is 150 Angstroms.

21. The method of claim 1, wherein the etch stop layer has a thickness of about 1000 to 2000 angstroms.

22. The method of claim 21, wherein the thickness is 1500 angstroms.

23. The method of claim 1, wherein the conductive material is doped.

24. The method of claim 23, wherein the conductive material is doped before being formed or doped after being formed using a masked implant step.

25. The method of claim 1, wherein the gate dielectric layer is a high k oxide material.

26. The method of claim 25, wherein the material is one of the following: silicon nitride, silicon oxide, tantalum oxide, zirconium oxide, or hafnium oxide.

27. The method of claim 1, wherein the conductive material is deposited in the patterned openings and above an intermediate structure of the transistor, and is about 500 to 1500 angstroms thick from the top of the intermediate structure.

28. The method of claim 27, wherein the conductive material is about 1000 angstroms thick.

29. The method of claim 27, wherein the conductive material is chemically mechanically polished down so that it is only in the patterned openings.

* * * * *

UNITED STATES PATENT AND TRADEMARK OFFICE
CERTIFICATE OF CORRECTION

PATENT NO.    : 6,380,088 B1
DATED         : April 30, 2002
INVENTOR(S)   : Lap Chan, Elgin Quek, Ravi Sundaresan, Yang Pan, James Yong Meng Lee, Ying Keung Leung, Yelehanka Ramachandramurthy Pradeep and Jia Zhen Zheng It is certified that error appears in the above-identified patent and that said Letters Patent is hereby corrected as shown below:

<u>Title page,</u>
Item [75], delete "Aberdeen", and replace with -- Hong Kong --.

Signed and Sealed this

Nineteenth Day of November, 2002

*Attest:*

*Attesting Officer*

JAMES E. ROGAN
*Director of the United States Patent and Trademark Office*